(12) United States Patent
Li et al.

(10) Patent No.: US 11,295,676 B2
(45) Date of Patent: Apr. 5, 2022

(54) SHIFT REGISTER UNIT AND DRIVING METHOD THEREOF, GATE DRIVING CIRCUIT AND DISPLAY APPARATUS

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Yunze Li, Beijing (CN); Ni Yang, Beijing (CN); Hengyi Xu, Beijing (CN); Hui Li, Beijing (CN); Mengqiu Liu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 210 days.

(21) Appl. No.: 16/618,797

(22) PCT Filed: Jun. 11, 2019

(86) PCT No.: PCT/CN2019/090692
§ 371 (c)(1),
(2) Date: Dec. 2, 2019

(87) PCT Pub. No.: WO2020/082750
PCT Pub. Date: Apr. 30, 2020

(65) Prior Publication Data
US 2021/0327359 A1 Oct. 21, 2021

(30) Foreign Application Priority Data
Oct. 22, 2018 (CN) .......................... 201811231653.5

(51) Int. Cl.
*G09G 3/3266* (2016.01)
*G09G 3/36* (2006.01)
*G11C 19/28* (2006.01)

(52) U.S. Cl.
CPC ......... *G09G 3/3266* (2013.01); *G09G 3/3677* (2013.01); *G11C 19/28* (2013.01);
(Continued)

(58) Field of Classification Search
CPC ............... G09G 3/3266; G09G 3/3677; G09G 2310/06; G09G 2300/043; G09G 2310/0286; G09G 2310/08; G11C 19/28
See application file for complete search history.

(56) References Cited

U.S. PATENT DOCUMENTS

2007/0274433 A1* 11/2007 Tobita .................. G09G 3/3677
377/64
2017/0287428 A1* 10/2017 Xue .................... H01L 27/1214

FOREIGN PATENT DOCUMENTS

| CN | 106328084 A | 1/2017 |
| CN | 108230984 A | 6/2018 |

OTHER PUBLICATIONS

International Search Report in Application No. PCT/CN2019/090692, dated Sep. 2, 2019.

* cited by examiner

*Primary Examiner* — Premal R Patel
(74) *Attorney, Agent, or Firm* — Syncoda LLC; Feng Ma

(57) ABSTRACT

A shift register unit includes a shift circuit having first, second, and third power supply signal terminals respectively coupled to first, second, and third power supply lines configured respectively to transmit first, second, and third power supply signals; and configured to respond to the first or second power supply signal and output the signal from a first node to an output terminal; a signal generating circuit
(Continued)

respectively coupled to the first and second power supply lines and the first node, and configured to output the second power supply signal to the first node when an electric potential of the first power supply signal is an effective potential, and output the first power supply signal to the first node when the electric potential of the second power supply signal is an effective potential, wherein the electric potentials of the first and second power supply signals are complementary to each other.

20 Claims, 5 Drawing Sheets

(52) U.S. Cl.
CPC ............... *G09G 2300/043* (2013.01); *G09G 2310/0286* (2013.01); *G09G 2310/06* (2013.01); *G09G 2310/08* (2013.01)

SHIFT REGISTER UNIT AND DRIVING METHOD THEREOF, GATE DRIVING CIRCUIT AND DISPLAY APPARATUS

CROSS-REFERENCE TO RELATED APPLICATION

The present application claims priority to Chinese Patent Application No. 201811231653.5 filed on Oct. 22, 2018, the disclosure of which is hereby incorporated by reference in its entirety.

TECHNICAL FIELD

The present disclosure relates generally to a field of display technologies, and specifically to a shift register unit and driving method thereof, a gate driving circuit and a display apparatus.

BACKGROUND

Shift register generally can include a plurality of cascaded shift register units, each shift register unit can be utilized to drive a line of pixel units, scanning of each line of pixel units in a display apparatus can be realized through the plurality of cascaded shift register units such that an image can be displayed.

SUMMARY

Embodiments of the present disclosure provide a shift register unit and a driving method thereof, a gate driving circuit, and a display apparatus.

In an aspect, a shift register unit is provided, including:
a shift circuit; and
a signal generating circuit;
wherein:
the shift circuit includes a first power supply signal terminal, a second power supply signal terminal, a third power supply signal terminal and an output terminal, the first power supply signal terminal being connected to a first power supply line, the first power supply line being utilized to transmit a first power supply signal; the second power supply signal terminal being connected to a second power supply line, the second power supply line being utilized to transmit a second power supply signal; the third power supply signal terminal being connected to a third power supply line, the third power supply line being utilized to transmit a third power supply signal; the shift circuit being configured to respond to the first power supply signal or the second power supply signal and output an output signal from a first node to the output terminal; and
the signal generating circuit being respectively connected to the first power supply line, the second power supply line, and the first node, the signal generating circuit being configured to output the second power supply signal to the first node when an electric potential of the first power supply signal is an effective potential, and the signal generating circuit also being configured to output the first power supply signal to the first node when the electric potential of the second power supply signal is an effective potential, and wherein the electric potential of the first power supply signal and the electric potential of the second power supply signal are complementary to each other.

In some embodiments, the signal generating circuit includes:
a first signal generating sub-circuit; and
a second signal generating sub-circuit;
wherein:
the first signal generating circuit is respectively connected to the first power supply line, the second power supply line, and the first node, and wherein the first signal generating sub-circuit is utilized to transmit a second power supply signal when the electric potential of the first power supply signal is an effective potential;
the second signal generating sub-circuit is connected to the first power supply line, the second power supply line, and the first node, the second signal generating sub-circuit being utilized to transmit a first power supply signal to the first node when the electric potential of the second power supply signal is an effective potential.

In some embodiments, the first signal generating sub-circuit further includes:
a first transistor and a gate electrode, wherein:
the gate electrode of the first transistor is connected to the first power supply line,
the first electrode of the first transistor is connected to the second power supply line, and
the second electrode of the first transistor is connected to the first node.

In some embodiments, the second signal generating sub-circuit includes:
a second transistor; wherein:
the gate electrode of the second transistor is connected to the second power supply line, the first electrode of the second transistor is connected to the first power supply line, and the second electrode of the second transistor is connected to the first node.

In some embodiments, the transistor of the first signal generating sub-circuit and the transistor of the second signal generating sub-circuit are both N-type transistors.

In some embodiments, the shift circuit includes:
a first pull-down sub-circuit and a second pull-down sub-circuit;
wherein:
the first pull-down sub-circuit is respectively connected to the first power supply signal terminal, the third power supply signal terminal and the output terminal, the first pull-down sub-circuit response to the first power supply signal and outputs the signal form the third power supply signal terminal to the output terminal;
the second pull-down sub-circuit is respectively connected to the second power supply signal terminal, the third power supply signal terminal and the output terminal, the second pull-down sub-circuit responses to the second power supply signal and outputs the signal from the third power supply signal terminal to the output terminal.

In some embodiments, the shift circuit further includes:
a clock signal terminal;
an input signal terminal; and
a reset signal terminal;
wherein:
the clock signal terminal is connected to a clock signal line that is utilized to transmit a clock signal;
the shift circuit further responses to an input signal from the input signal terminal and output the clock signal from the clock signal terminal to the output terminal, and response to the reset signal from the reset signal terminal, the first power supply signal and the second power supply signal and outputs the signal from the first node to the output terminal.

In some embodiments, the method can be applied to the shift register unit, the method including:

transmitting, in a first stage, the electric potential of the first power supply signal utilizing the first power supply line that the electric potential of the first power supply is an effective potential;

transmitting, in the first stage, the electric potential of the second power supply signal transmitted by the second power supply line that the electric potential of the second power supply is an ineffective potential;

utilizing the signal generating circuit to respond to the first power supply signal and output the second power supply signal to the first node;

utilizing the shift circuit to respond to the first power supply signal and output a corresponding signal from the first node to the output terminal;

transmitting, during a second stage, the electric potential of the first power supply signal utilizing the first power supply line that the electric potential of the first power supply is an in effective potential;

transmitting, in the second stage, the electric potential of the second power supply signal transmitted by the second power supply line is an effective potential, the signal generating circuit responses to the second power supply signal and outputs the first power supply signal to the first node, the shift circuit responses to the second power supply signal and outputs the signal from the first node to the output terminal.

In some embodiments, the signal generating signal includes a first signal generating sub-circuit and a second signal generating sub-circuit, wherein the first signal generating sub-circuit includes a first transistor, and wherein the second signal generating sub-circuit includes a second transistor;

wherein:

during the first stage, the electric potential of the first power supply signal is an effective potential, the electric potential of the second power supply signal is an ineffective potential, the first transistor is turned on, the second power supply line outputs the second power supply signal to the first node through the first transistor;

during the second stage, the electric potential of the first power supply signal is an ineffective potential, the electric potential of the second power supply signal is an effective potential, the second transistor is turned on, the first power supply line outputs the first power supply signal to the first node through the second transistor.

In some embodiments, the gate driving circuit includes at least two cascaded shift register units;

wherein among the at least two cascaded shift register units, at least one shift register unit is the shift register unit.

In some embodiments, among the at least two cascaded shift register units, each individual shift register unit is a shift register unit.

In some embodiments, the gate driving circuit further includes a plurality of clock signal lines, at least one clock signal line associates with each cascaded shift register unit.

In some embodiments, a total of four clock signal lines are provided in the gate driving circuit.

In some embodiments, among the at least two cascaded shift register units, the first shift register unit of one or more pairs of adjacent shift register units is the shift register unit, the second shift register unit includes a shift circuit; and the third power supply signal terminal of the shift circuit of the second shift register unit is connected to the first node of the first shift register unit.

In some embodiments, the plurality of cascaded shift register units are provided in a plurality of pairs, wherein at least one shift unit of each pair of adjacent shift register units can be the shift register unit having an associated shift circuit and an associated signal generating circuit wherein a second shift register unit of the pair does not include an associated signal generating circuit.

In some embodiments, each of the plurality of cascaded shift register units include an associated shift circuit and an associated signal generating circuit.

In another aspect, a display apparatus is provided having a display screen having at least one associated gate driving circuit, the gate driving circuit being configured to drive at least a portion of the display screen of the display apparatus.

In some embodiments, the display screen includes a liquid-crystal display (LCD).

In some embodiments, the display screen includes an organic light-emitting diode (OLED) display.

In some embodiments, the display apparatus further includes:

a speaker; and a controller configured to control the display screen and the speaker.

Other embodiments and implementations may become apparent in view of the following descriptions and the attached drawings.

BRIEF DESCRIPTION OF DRAWINGS

To more clearly illustrate some of the embodiments, the following is a brief description of the drawings.

The drawings in the following descriptions are only illustrative of some embodiments. For those of ordinary skill in the art, other drawings of other embodiments can become apparent based on these drawings.

DETAILED DESCRIPTION

Figure 1:
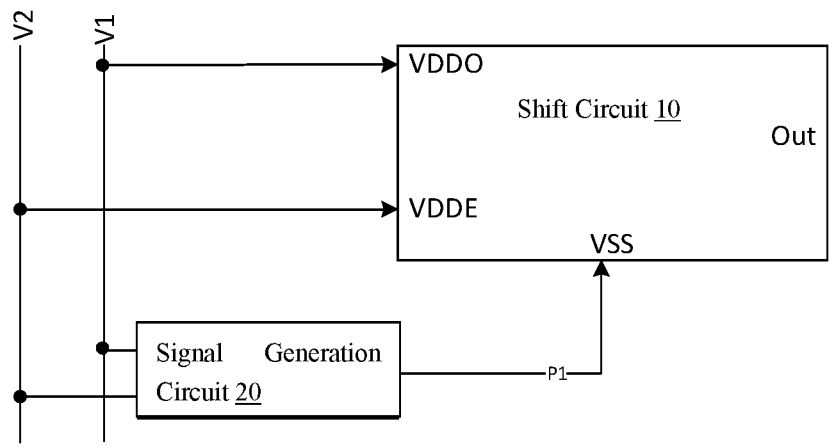
FIG. 1 illustrates a structural diagram of a shift register unit according to some embodiments of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. can be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or other structure is referred to as being "on" or extending "onto" another element, it can be directly on or extend directly onto the other element or intervening elements can also be present. In contrast, when an element is referred to as being "directly on" or extending "directly onto" another element, there are no intervening elements present.

Likewise, it will be understood that when an element is referred to as being "connected" or extending "to" another element, it can be directly over or extend directly over the other element or intervening elements can also be present. In contrast, when an element is referred to as being "directly connected" or extending "directly to" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Relative terms such as "below" or "above" or "upper" or "lower" or "horizontal" or "horizontal" can be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The inventors of the present disclosure have recognized that, in existing technologies, in order for a shift register unit to work normally, a plurality of signal lines are needed to be provided at the periphery region of a display substrate. For example, signal lines that can transmit clock signals, signal lines that can transmit high electric potential signals and signal lines that can transmit low electric potential signals are needed to be provided at the periphery region of a display substrate.

A Gate Driver on Array (GOA) architecture is widely used for cost reduction and to achieve narrow-frame products.

However, because a plurality if signal lines (e.g., CLK, VDDO, VDDE, VGL, LVGL, etc.) may need to be provided at the periphery region of the display substrate, the space occupied by the plurality of signal lines are relatively large, and a conventional GOA architecture is increasingly unable to meet the needs of extremely narrow frames, high resolution, and large size products.

Various embodiments of the present disclosure provide a shift register unit and driving method thereof, a gate driving circuit and a display apparatus. The shift register unit can include a signal generating circuit, the signal generating circuit can transmit a signal which electric potential is ineffective to the third power supply signal terminal of the shift circuit when the first power supply line transmits the first power supply signal which electric potential is effective to the shift circuit and the second power supply line transmits the second power supply signal which electric potential is effective to the shift circuit.

Because there is no need to provide a signal line that transmit signal which electric potential is ineffective to a third power supply signal terminal at the periphery region of the display substrate, the number of signal lines provided at the periphery region of a display substrate can be reduced, it is advantageous for realizing display devices with narrower borders.

It should be understood, the transistors according to embodiments of the present disclosure can be provided as all or a combination of thin-film transistors (TFTs), transverse field transistors, or other components having similar characteristics. The transistor illustrated in the various embodiments of the present disclosure as contained herein are shown as switch transistors based on their functions in the electric circuits. As illustrated herein, the source electrode and the drain electrode are interchangeable because the source electrode and the drain electrode of a switch transistor are provided in a symmetric configuration.

In the embodiments of the present disclosure, the source electrode can be referred to as a first electrode, and the drain electrode can be referred to as a second electrode. According to the embodiments as illustrated in the figures, the middle or central portion of a transistor can function as agate electrode. Additionally, the signal input terminal can be utilized as a source electrode and the signal output terminal can be utilized as a drain electrode.

In addition, the transistors according to embodiments of the present disclosure can be provided as either P-type transistors or N-type transistors. In such embodiments, a P-type transistor can be turned on when an associated gate electrode is at low electric potential and turned off when the associated gate electrode is at high electric potential.

Additionally, an N-type transistor can be turned on when the gate electrode is at high electric potential and turned off when the gate electrode is at low electric potential.

In addition, the plurality of signals according to embodiments of the present disclosure can all function either at an effective potential or at an ineffective potential. In such embodiments, the effective potential and ineffective potential only refer to the electric potential of a signal which can have two different states, wherein the effective potential and the ineffective potential do not refer to specific values but only refer to the effectiveness of the particular potential.

With the development of display technologies, in order to reduce the number of driving circuits provided at the periphery region of a display substrate, reduce the manufacturing cost of the display devices and realize narrower border display devices, the shift register units are generally manufactured through gate driver on array (GOA) technologies.

In existing technologies, a shift register unit can include signal terminals such as a first power supply signal terminal, a second power supply signal terminal, a third power supply signal terminal, a clock signal terminal, and an input signal terminal and a reset signal terminal. In such systems, in order to drive the shift register unit to work, signal lines are utilized to transmit signals to each signal terminal must be provided at the periphery region of the display substrate.

In existing technologies, a first power supply line that can transmit a first power supply signal to a first power supply signal terminal, a second power supply line than can transmit a second power supply signal to a second power supply signal terminal, a third power supply line that can transmit a third power supply signal which electric potential is ineffective to a third power supply signal terminal.

Additionally, in such systems a clock signal line is provided which can transmit a clock signal to a clock signal terminal wherein the clock signal terminal can be provided at the periphery region of the display substrate. In addition, these existing systems require the widths of the signal lines to be relatively large in order to reduce resistance and prevent the influence on the display effects caused by signal attenuation of the signal outputted by the output terminal of the shift register unit resulted from large resistance.

Due to the increased width of the signal lines they can occupy a larger associated space of the periphery region, and further, because the number of signal lines provided at the periphery region of the display substrate in existing technologies need to be large and the widths of the signal lines are also relatively large, it is not advantageous for realizing narrower border display devices and this problem has become a bottleneck in development of narrower border display products.

In order to solve these and other problems of existing technologies a first aspect of the present invention involves a shift register unit which can be provided into various display technologies. In particular, as illustrated in FIG. 1, the shift register unit can include: a shift circuit 10 and a signal generating circuit 20.

The shift circuit 10 can include a first power supply signal terminal VDDO, a second power supply signal terminal VDDE, a third power supply signal terminal VSS, and an output terminal OUT. In such embodiments, the first power supply signal terminal VDDO can be connected to a first power supply line V1 that can transmit a first power supply signal.

Similarly, the second power supply signal terminal VDDE can be connected to a second power supply line V2 that can transmit a second power supply signal. In the embodiment illustrated here, the third power supply signal terminal VSS can be connected to a first node P1 that can transmit a signal which electric potential is ineffective. In this embodiment, the shift circuit 10 can be configured so as to respond to the first power supply signal or the second power supply signal and output a signal from the first node P1 to the output terminal OUT.

In some embodiments, the shift circuit 10 can output the signal from the first node P1 to the output terminal OUT when the electric potential of the first power supply signal transmitted by the first power supply line V1 is effective.

Alternatively, the shift circuit 10 can output the signal from the first node P1 to the output terminal OUT when the electric potential of the second power supply signal transmitted by the second power supply line V2 is effective.

The signal generating circuit 20 can then be respectively connected to the first power supply line V1, the second power supply line V2, and the first node P1. In this manner, the signal generating circuit 20 can output the second power supply signal to the first node P1 when the electric potential of the first power supply signal is effective and output the first power supply signal to the first node P1 when the electric potential of the second power supply signal is effective. In some such embodiments, the electric potential of the first power supply signal and the electric potential of the second power supply signal can be complementary to one another.

In some additional embodiments wherein the electric potentials of the second power supply signals are complementary to each other can refer to situations in which: when the potential of one of the power supply signals is effective, the potential of the other power supply signal is ineffective; when the potential of one of the power supply signals is ineffective, the potential of the other power supply signal is effective.

According to some embodiments of the present disclosure, the signal generating circuit 20 can output a signal corresponding to which electric potential is ineffective to the first node P1 under the control of the first power supply signal transmitted by the first power supply line V1 and the second power supply signal transmitted by the second power supply line V2.

In other words, the signal generating circuit 20 can transmit a signal indicative of which electric potential is ineffective to the third power supply signal terminal VSS of the shift circuit 10. As a result, in this embodiment there is no need to provide a third power supply line in order to transmit signal which electric potential is ineffective at the periphery region of the display substrate.

As described above, various embodiments of the present disclosure provide a shift register unit, wherein the shift register unit can include a signal generating circuit. The signal generating circuit as contemplated herein can transmit a signal indicative of which electric potential is ineffective to the third power supply signal terminal of the shift circuit when the first power supply line transmits the first power supply signal which electric potential is effective to the shift circuit.

In such embodiments, the second power supply line can then transmit the second power supply signal which is indicative of which electric potential is effective to the shift circuit. In this manner, the number of signal lines provided at the periphery region of the display substrate can be reduced because there is no need to provide a signal line in order to transmit signal which electric potential is ineffective to the third power supply signal terminal at the periphery region of the display substrate separately.

As such, this arrangement is beneficial for realizing narrower border display devices due to the elimination of the need for this signal line.

In addition, in the shift register units according to embodiments of the present disclosure, there is no need to provide pins over the integrated circuit, which are typically utilized to guide out signal lines that are utilized to transmit signals which electric potential is ineffective.

Additionally, the risk of electrostatic discharge (ESD) can be reduced, and the yield rate of display devices can be increased because the pins of the integrated circuit can be reduced, which also allows for a reduction in the error rate of bonding each signal line and each signal terminal.

Figure 2:
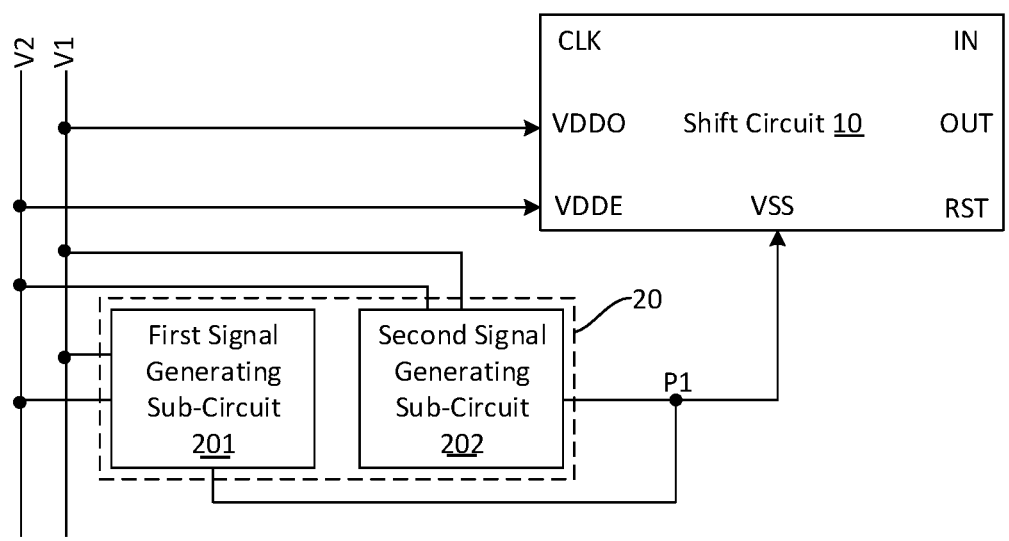
FIG. 2 illustrates a structural diagram of another shift register unit according to some other embodiments of the present disclosure.

FIG. 2 illustrates a structural diagram of another shift register unit according to various additional embodiments of the present disclosure. As illustrated in FIG. 2, the signal generating circuit 20 can include: a first signal generating sub-circuit 201 and a second signal generating sub-circuit 202.

In such embodiments, the first signal generating sub-circuit 201 can be respectively connected to the first power supply line V1, the second power supply line V2, and the first node P1. In such an arrangement, the first signal generating sub-circuit 201 can output a second power supply signal to the first node P1 when the electric potential of the first power supply signal is effective.

The second signal generating sub-circuit 202 in this embodiment can be respectively connected to the first power supply line V1, the second power supply line V2, and the first node P1. In such an arrangement, the first signal generating sub-circuit 201 can output a first power supply signal to the first node P1 when the electric potential of the second power supply signal is effective.

Figure 3:
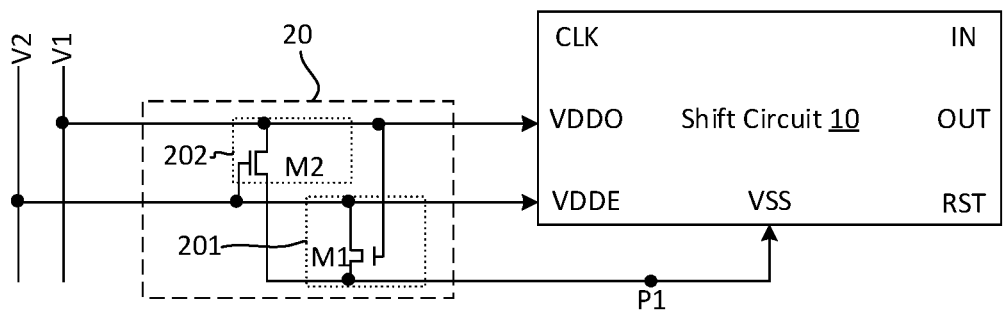
FIG. 3 illustrates a structural diagram of yet another shift register unit according to yet some other embodiments of the present disclosure.

FIG. 3 illustrates a structural diagram of yet another shift register unit according to yet some other embodiments of the present disclosure. As illustrated in FIG. 3, the first signal generating sub-circuit 201 can also include a first transistor M1.

In such an embodiment, the gate electrode of the first transistor M1 can be connected to the first power supply line V1, the first electrode of the first transistor M1 can be connected to the second power supply line V2, and second electrode of the first transistor M1 can be connected to the first node P1.

In some embodiments, as illustrated in FIG. 3, the second signal generating circuit 202 can also include a second transistor M2.

In such embodiments the gate electrode of the second transistor M2 can be connected to the second power supply line V2, the first electrode of the second transistor M2 can be connected to the first power supply line V1, and the second electrode of the second transistor M2 can be connected to the first node P1.

According to some such embodiments, the first transistor M1 and the second transistor M2 can both be provided at a reserved dummy region of the shift register unit. In such embodiments, the space occupied by the shift register unit can be minimized because the first transistor M1 and the second transistor M2 occupy significantly less space.

In some embodiments, the transistors included in the first signal generating sub-circuit 201 and the second signal generating sub-circuit 202 can all be N-type transistors. Accordingly, the effective potential can be a high electric potential when compared with the ineffective potential.

Figure 4:
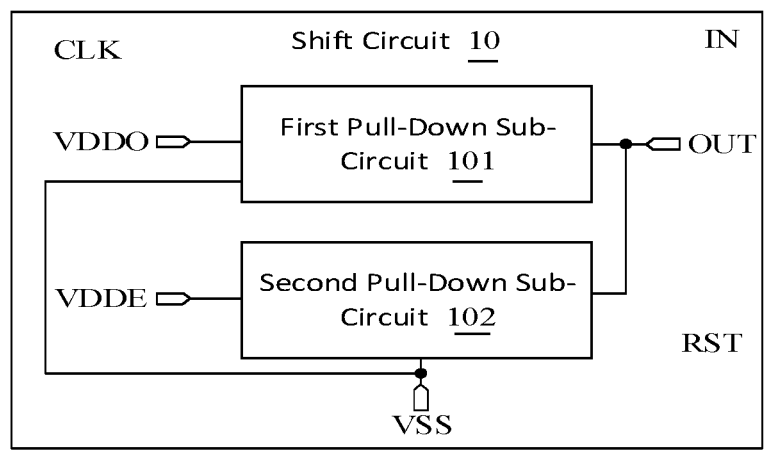
FIG. 4 illustrates a structural diagram of a shift circuit according to some embodiments of the present disclosure.

FIG. 4 illustrates a structural diagram of a shift circuit 10 according to some embodiments of the present disclosure. In some embodiments, As illustrated in FIG. 4, the shift circuit 10 can include a first pull-down sub-circuit 101 and a second pull-down sub-circuit 102.

In some such embodiments, the first pull-down sub-circuit 101 can be respectively connected to the first power supply signal terminal VDDO, the third power supply signal terminal VSS, and the output terminal OUT. In this arrangement, the first pull-down sub-circuit 101 can respond to the first power supply signal and output the signal from the third power supply signal terminal VSS to the output terminal OUT.

In some embodiments, the first pull-down sub-circuit 101 can output the signal from the third power supply signal terminal VSS to the output terminal OUT when the electric potential of the first power supply signal is effective.

In this arrangements, the first pull-down sub-circuit 101 can output signal which electric potential is ineffective to the output terminal OUT because the third power supply signal terminal VSS can be connected to the first node P1 that is utilized to transmit signal which electric potential is ineffective, In this manner the first pull-down circuit 101 can thus reset the output terminal OUT of the shift circuit 10.

In some embodiments, the second pull-down sub-circuit 102 can be respectively connected to the second power supply signal terminal VDDE, the third power supply signal terminal VSS, and the output terminal OUT.

In such arrangements, the second pull-down sub-circuit 102 can respond to the second power supply signal and output the signal from the third power supply signal terminal VSS to the output terminal OUT.

In some embodiments, the second pull-down sub-circuit 102 can output a signal from the third power supply signal terminal VS S to the output terminal OUT when the electric potential of the second power supply signal is effective.

The second pull-down sub-circuit 102 can output signal which electric potential is ineffective to the output terminal OUT because the third power supply signal terminal VSS can be connected to the first node P1 which is utilized to transmit signal which electric potential is ineffective. As a result, resetting of the output terminal OUT of the shift circuit 10 can be realized.

The working life of the shift register having two pull-down sub-circuits according to embodiments of the present disclosure can be longer as compared to only providing one pull-down sub-circuit to reset the output terminal of the shift circuit 10 in existing technologies.

In addition, the signal generating circuit 20 can output signals which electric potentials are ineffective to the third power supply terminal VSS of the shift circuit 10 continuously, the reliability of the shift register unit can be improved because the power supply signal terminal which controls the two pull-down sub-circuits are the first power supply line V1 and the second power supply line V2 which transmit signals which electric potentials are complementary to each other, and the first power supply line V1 and the second power supply line V2 can output power supply signals which electric potentials are continuously complementary to one another.

In some embodiments, as illustrated in FIG. 2, FIG. 3 and FIG. 4, the shift circuit 10 can further include a clock signal terminal CLK, an input signal terminal IN, and a reset signal terminal RST. In such an embodiment, the clock signal terminal CLK can be connected to a clock signal line that is utilized to transmit a clock signal.

In this embodiment, the input terminal IN can be connected to the output terminal OUT of a shift circuit 10 of an upper level shift register unit. Additionally, in some such embodiments, the reset signal terminal RST can be connected to the output terminal OUT of the shift circuit 10 of a lower level shift register unit, not shown in FIG. 2, FIG. 3 and FIG. 4.

As contemplated herein, the shift circuit 10 can also respond to the input signal from the input signal terminal IN and output the clock signal to the output terminal OUT. In some such embodiments the shift circuit 10 can also respond to the reset signal from the reset signal terminal RST, the first power supply signal, and the second power supply signal and output signal from the first node P1 to the output terminal OUT.

In some embodiments, the shift circuit 10 can include a pull-up node, the shift circuit 10 can charge the pull-up node when the electric potential of the input signal provided by the input signal terminal IN is effective. In such embodiments, the shift circuit 10 can then output the clock signal to the output terminal OUT when the electric potential of the clock signal provided by the clock signal line is effective. As a result, scanning of one line of pixels can thus be realized.

In some additional embodiments, the shift circuit 10 can be further configured so as to allow a reset of the pull-up node when the electric potential of the reset signal provided by the reset signal terminal RST is effective. In such instances the shift circuit can then output signal from the first node P1 to the output terminal OUT when the electric potential of the first power supply signal is effective or the electric potential of the second power supply signal is effective.

In addition, resetting of the output terminal OUT can be realized in this manner because the electric potential of the signal from the first node P1 are ineffective when the electric potential of the first power supply signal is effective and the electric potential of the second power supply signal is effective.

As described above, the shift register unit according to some embodiments of the present disclosure can include a signal generating circuit.

In such embodiments, the signal generating circuit can be utilized so as to transmit a signal indicative of which electric potential is ineffective to the third power supply signal terminal of the shift circuit. In such embodiments, the first power supply line can transmit the first power supply signal corresponding to which electric potential is effective to the shift circuit and the second power supply line can also transmit the second power supply signal corresponding to which electric potential is effective to the shift circuit.

In these embodiments, the number of signal lines provided at the periphery region of the display substrate can be reduced, which is advantageous for realizing narrower border display devices because, as discussed above, there is no need to provide a signal line in order to transmit a signal regarding which electric potential is ineffective to the third power supply signal terminal at the periphery region separately.

In addition, in embodiments utilizing the shift register units according to embodiments of the present disclosure, there is no need to provide pins over the integrated circuit. Which pins are typically utilized to guide out signal lines that are utilized to transmit signals of which electric potential are ineffective. Due to the reduction of number of pins of the integrated circuit, the error rate of bonding each signal line and each signal terminal can be reduced.

In this manner, the risk of electrostatic discharge (ESD) can be reduced, and the yield rate of display devices can be increased.

Figure 5:
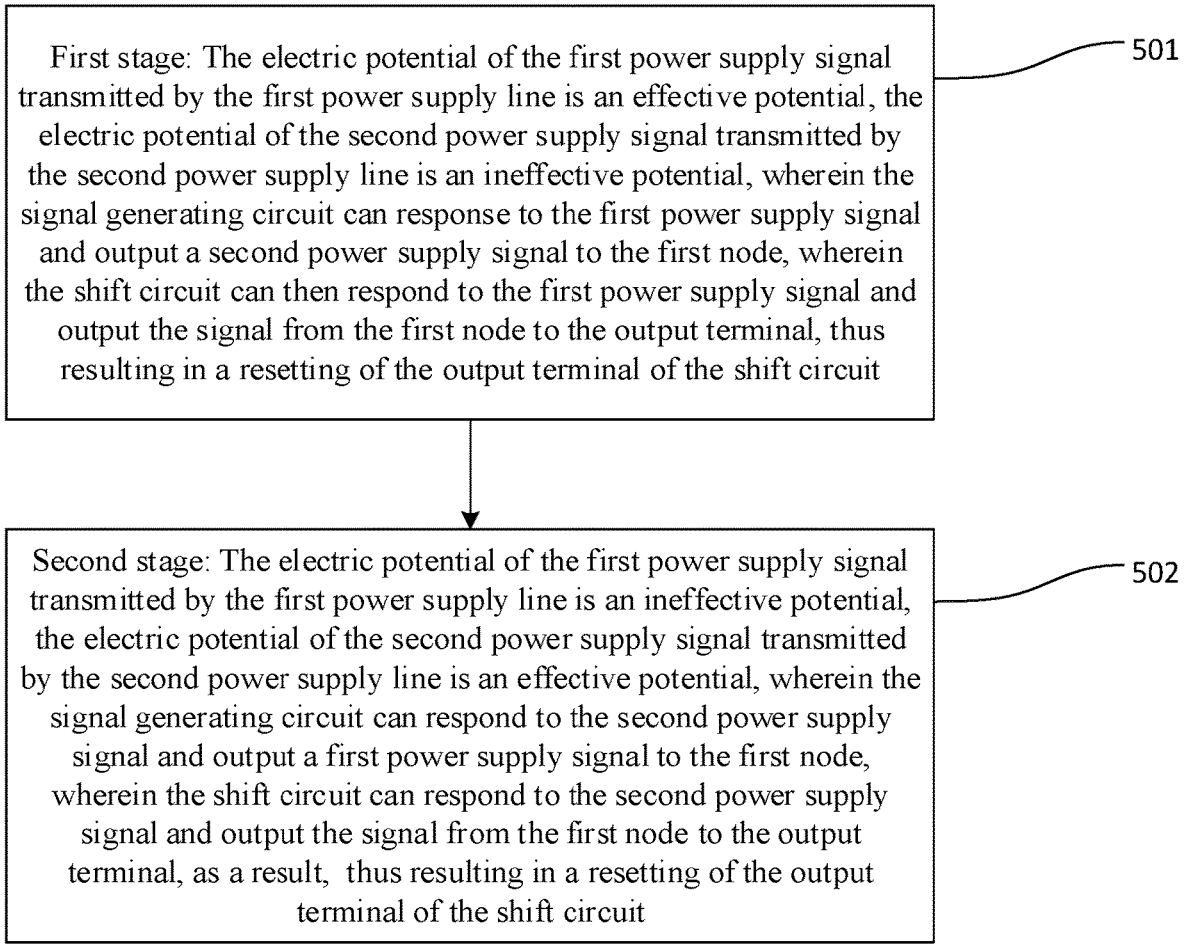
FIG. 5 illustrates a flow chart of a driving method of a shift register unit according to some embodiments of the present disclosure.

In another aspect, a driving method of a shift register unit can be provided. FIG. 5 illustrates a flow chart of a driving method of a shift register unit according to embodiments of the present disclosure, wherein the method illustrated here can be utilized in conjunction with any one of the shift register units illustrated in FIG. 1, FIG. 2 and FIG. 3.

As illustrated in FIG. 5, the method can include:

Step 501, wherein, during the first stage, in a situation in which the electric potential of the first power supply signal transmitted by the first power supply line is effective, and wherein the electric potential of the second power supply signal transmitted by the second power supply line is ineffective, the signal generating circuit can respond to the first power supply signal and output the second power supply signal to the first node. Further, the shift circuit can similarly respond to the first power supply signal and output signal from the first node to the output terminal. As a result, resetting of the output terminal of the shift circuit can be realized.

Step 502, wherein, during the second stage, in a situation in which the electric potential of the first power supply signal transmitted by the first power supply line is ineffective, and wherein the electric potential of the second power supply signal transmitted by the second power supply line is effective, the signal generating circuit can respond to the second power supply signal and output the first power supply signal to the first node, and wherein the shift circuit can then respond to the second power supply signal and output signal from the first node to the output terminal. As a result, resetting of the output terminal of the shift circuit can be realized.

As described above, embodiments of the present disclosure provide a driving method of a shift register unit. During the first stage, the signal generating circuit can output a second power supply signal which electric potential is ineffective to the first node, e.g. to the third power supply signal terminal, under the control of the first power supply signal; during the second stage, the signal generating circuit can then output a first power supply signal which electric potential is ineffective to the first node under the control of the second power supply signal.

In this embodiment, the number of signal lines provided at the periphery region of the display substrate can be reduced because there is no need to provide a signal line that can be utilized to transmit signal which electric potential is ineffective to the third power supply signal terminal separately.

As a result of the reduced number of signal lines, narrower-border display devices can thus be achieved.

In addition, in the shift register units according to embodiments of the present disclosure, there is no need to provide pins over the integrated circuit in order to guide out signal lines, which are typically utilized to transmit signals which electric potential are ineffective.

This reduction of number of pins of the integrated circuit allows for a reduction in error rate of bonding between each signal line and each signal terminal. As a result, the risk of electrostatic discharge (ESD) can be reduced, and the yield rate of display devices can be increased.

In addition, the power consumption during the working process of the shift register unit can be reduced, the working life of the shift register unit can be prolonged and the working life of the display device can be prolonged.

The driving principles of the shift register units according to embodiments of the present disclosure will be described in detail with the example of the shift register unit illustrated in FIG. 3.

In the example, all transistors are illustrated as N-type transistors and the effective potential is a high potential compared with the ineffective potential.

As illustrated in FIG. 3, the signal generating circuit 20 can include: the first signal generating sub-circuit 201 and the second signal generating sub-circuit 202. In such an embodiment, the first signal generating sub-circuit 201 can include a first transistor M1, wherein the second signal generating sub-circuit 202 can include a second transistor M2.

Figure 6:
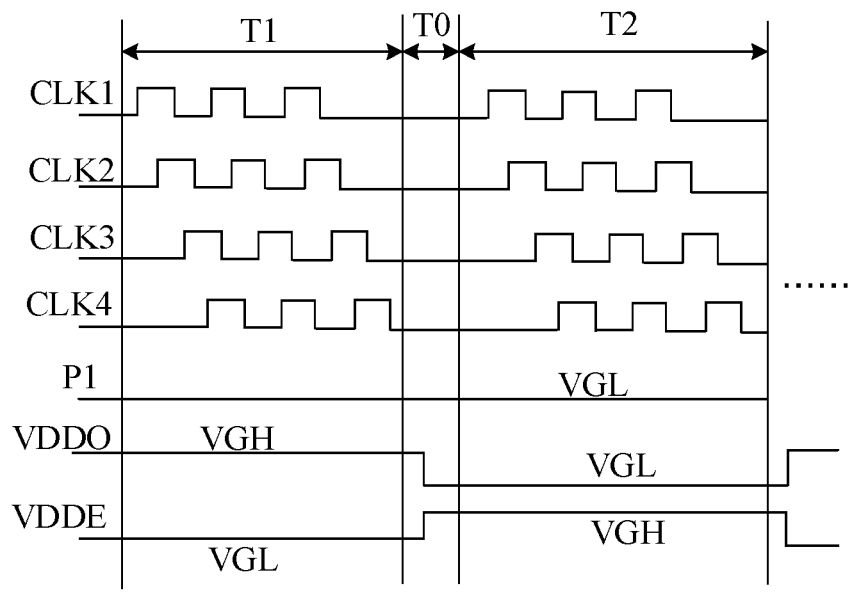
FIG. 6 illustrates a time sequence diagram of signal outputting of each signal terminal of a gate driving circuit according to some embodiments of the present disclosure.

FIG. 6 illustrates a time sequence diagram of signal outputting of each signal terminal in a gate driving circuit according to embodiments of the present disclosure.

As illustrated in FIG. 6, during the first stage T1, the electric potential of the first power supply signal transmitted by the first power supply line V1 to the first power supply signal terminal VDDO is an effective potential, e.g., VGH, wherein the first transistor can be turned on and the electric potential of the second power supply signal transmitted by the second power supply line V2 to the second power supply signal terminal VDDO is an ineffective potential, e.g., VGL, and the second transistor can be turned off.

In such an instance, the second power supply line V2 can transmit the second power supply signal which electric potential is ineffective to the first node P1 through the first transistor M1.

In such a situation, the signal generating circuit 20 can transmit power supply signal which electric potential is ineffective to the third power supply signal terminal VSS of the shift circuit 10 because the first node P1 can be connected to the third power supply signal terminal VSS of the shift circuit 10.

During the second stage T2, the electric potential of the first power supply signal transmitted by the first power supply line V2 to the first power supply signal terminal VDDO can be jumped so as to cause it to be an ineffective potential, and simultaneously the first transistor M1 can be turned off.

In such an instance, the electric potential of the second power supply signal transmitted by the second power supply line V2 to the second power supply signal terminal VDDE can be jumped to be an effective potential, wherein the second transistor M2 can be turned on.

In such an instance, the first power supply line V1 can output the second power supply signal which electric potential is ineffective to the first node P1 through the second transistor M2. In other words, the signal generating circuit 20 can transmit power supply signal which electric potential is ineffective to the third power supply signal VSS of the shift circuit 10.

In some embodiments, and as illustrated in Table 1, the working process diagram of the signal generating circuit 20 is shown in which 1 represents effective potential, 0 represents ineffective potential.

As shown herein, when the electric potential of the first power supply signal transmitted by the first power supply line V1 to the first power supply signal terminal VDDO is an effective potential, the electric potential of the second power supply signal transmitted by the second power supply line V2 to the second power supply signal terminal VDDE is an effective potential.

In this situation, the first transistor M1 can be turned on, the second transistor M2 can be turned off. The second power supply line V2 can transmit signal which electric potential is ineffective to the first node, e.g. the third power supply terminal VSS through the first transistor M1.

TABLE 1

| VDDO | VDDE | M1 | M2 | VSS |
|------|------|----|----|-----|
| 1 | 0 | Turned on | Turned off | 0 |
| 0 | 1 | Turned off | Turned on | 0 |

In some embodiments, as illustrated in FIG. 6, the electric potentials of the first power supply signal and the second power supply signal can be jumped during the blanking time T0 between the displaying times of two adjacent image frames, this function ensures the shift register unit can work normally.

Figure 7:
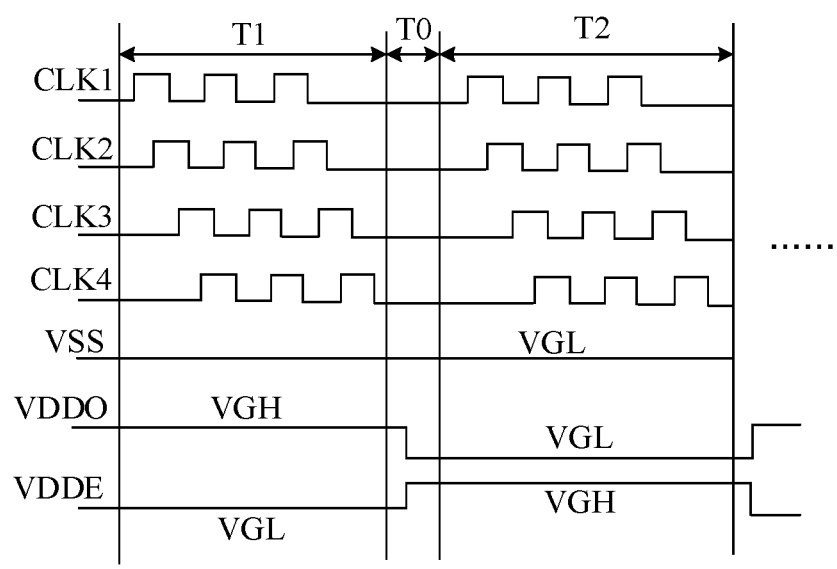
FIG. 7 illustrates a time sequence diagram of signal outputting of each signal terminal of a gate driving circuit in existing technologies.

FIG. 7 illustrates a time sequence diagram of the signal outputting of each signal terminal of a gate driving circuit in existing technologies.

As illustrated in FIG. 7, during the first stage T1 and the second stage T2, the electric potential of the signal transmitted by the third power supply line to the third power supply signal terminal VSS is an ineffective potential, e.g. VGL.

Contrasting FIG. 6 and FIG. 7, during the first stage T1 and the second stage T2, the time sequence of the signal transmitted by the signal generating circuit 20 to the first node P1 according to embodiments of the present disclosure is the same as the time sequence of the signal transmitted by the second power supply line to the third power supply signal terminal VSS.

In addition, because the first node P1 is connected to the third power supply signal terminal VSS, the shift register unit according to embodiments of the present disclosure can work normally when no third power supply line is provided at the periphery region of the display substrate.

In some embodiments, four clock signal lines CLK1, CLK2, CLK3 and CLK4 can be provided in the gate driving circuit. In other words, the gate driving circuit can have a four-phase clock.

FIG. 7 also illustrates: during the first stage T1 and the second stage T2, the changes of the electric potentials of the clock signals transmitted by the four clock signal lines CLK1, CLK2, CLK3 and CLK4 to the clock signal terminal CLK.

As described above, embodiments of the present disclosure provide a driving method of a shift register unit.

During the first stage, the signal generating circuit can output a second power supply signal regarding which electric potential is ineffective to the first node, e.g. to the third power supply signal terminal, under the control of the first power supply signal.

During the second stage, the signal generating circuit can output a first power supply signal which electric potential is ineffective to the first node under the control of the second power supply signal.

Similar to the embodiments discussed above, the number of signal lines provided at the periphery region can be reduced, which is advantageous for realizing narrower border display devices because there is no need to provide signal line that is utilized to transmit signal which potential is ineffective to the third power supply signal terminal at the periphery region of the display substrate.

In addition, in the shift register unit according to embodiments of the present disclosure, there is no need to provide pins over the integrated circuit, which are typically utilized in an integrated circuit to guide out each signal line, and are also utilized to guide out signal line that can be utilized to transmit signal which electric potential is ineffective.

As such, the rate of error when bonding each signal line and each signal terminal can be reduced, and the risk of electrostatic discharge (ESD) can be reduced, the yield rate of display devices can be increased because the number of pins of the integrated circuit can be reduced.

In addition, the power consumption during the working process of the shift register unit can be reduced, thus resulting in an increase in the working life of the shift register unit and an associated increase in the working life of the display device utilizing the register unit.

Figure 8:
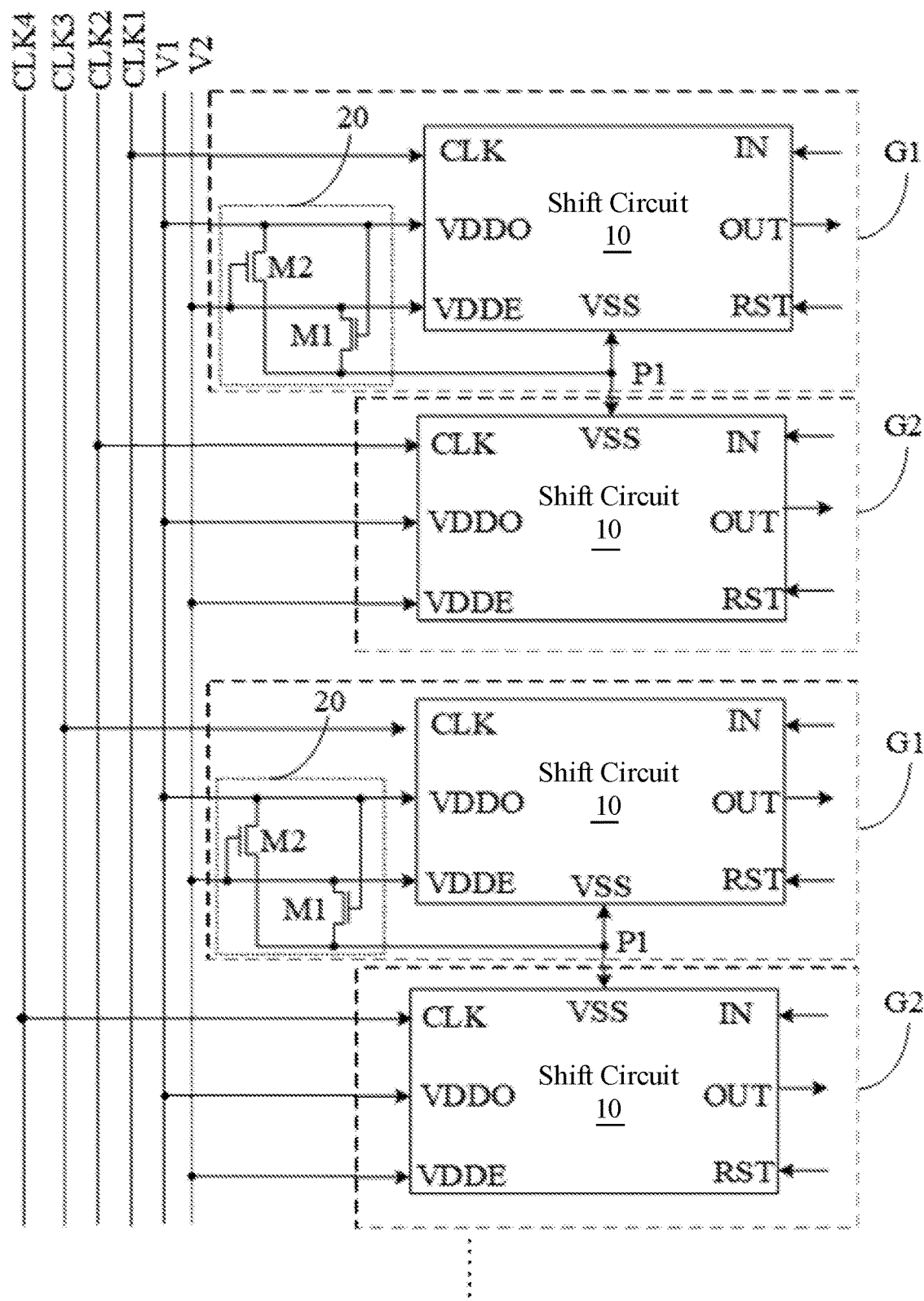
FIG. 8 illustrates a structural diagram of a gate driving circuit according to some embodiments of the present disclosure.

In another aspect, a gate driving circuit can be provided as illustrated in FIG. 8 which depicts a structural diagram of a gate driving circuit according to embodiments of the present disclosure.

As illustrated in FIG. 8, the gate driving circuit can include at least two cascaded shift register units. In addition, among the at least two cascaded shift register units, at least one of the shift register units can be any one of the shift register units according to embodiments of the present disclosure as illustrated in FIG. 1, FIG. 2 or FIG. 3. In other words, each shift register unit of the gate driving circuit can include a shift circuit 10 and a signal generating circuit 20.

In some other embodiments, as illustrated in FIG. 8, among the at least two cascaded shift register units, the first shift register unit G1 of each pair of adjacent shift register units can be the shift register unit according to embodiments of the present disclosure as illustrated in FIG. 1, FIG. 2 or FIG. 3

In other words, the first shift register unit G1 can include the shift circuit 10 and the signal generating circuit 20. The second shift register unit G2 can be a shift register unit that does not include the signal generating circuit 10, in other words, the second shift register unit G2 can include only the shift circuit 10.

In addition, as illustrated in FIG. 8, the third power supply signal terminal VSS of the shift circuit 10 of the second shift register unit G2 can be connected to the first node P1 of the first shift register unit G1.

In some such embodiments the first node P1 of the first shift register unit G1 can be connected to the third power supply signal terminal VSS of the shift circuit 10 of the second shift register unit G2 that does not include the signal generating circuit 20.

Further, in each pair of adjacent shift register units, the third power supply signal terminal VSS of the shift circuit 10 of the second shift register unit G2 that does not include the signal generating circuit 20 can also receive the signal from the first node P1 of the first shift register unit G1.

Therefore, while the number of signal lines at the periphery region of the display substrate can be reduced, the number of the signal generating circuit 20 can also be reduced. In other words, the circuit structure of the gate driving circuit can be simplified and the manufacturing cost can be reduced.

In some embodiments, as illustrated in FIG. 8, the gate driving circuit can be provided with four clock signal lines CLK1, CLK2, CLK3 and CLK4. In other words, the gate driving circuit can have a four-phase clock. Accordingly, the plurality of shift register units of the gate driving circuit can be divided into multiple groups, wherein each group can include four cascaded shift register units. In some such embodiments, the four shift register units of each group can be in turn connected to the four clock signal lines CLK1, CLK2, CLK3 and CLK4.

Also contemplated herein, are any number of display apparatuses which can be provided on any number electronics products with display functions as will be contemplated by those having skill in the art.

Such electronic devices can include, but are not limited to, electronic papers, mobile phones, tablet computers, TV, notebook computers, digital photo frames, wearable devices, or navigators, etc.

The display apparatus can be provided with a display screen, which can be a liquid-crystal display (LCD), an organic light-emitting diode (OLED) display, etc.

The display apparatus can further include, for example, a speaker, and a controller to control the speaker and the display screen. The display apparatus can be configured as a smart TV, for example, of which various modular components of speakers, microphones, antenna, receivers, set-top boxes, etc., to realize a reconfigurable/expandable/plug-and-play apparatus.

Advantageously, a new GOA unit design according to embodiments disclosed herein introduce a VSS (or VGL or LVGL) signal generation unit under the premise of ensuring the normal operation of the GOA unit, and therefore can facilitate realizing extremely narrow-boarder display screens.

In an example, two TFTs (T1 and T2) are added to the dummy area between each two lines to form a VSS generation unit, which is connected to VDDE and VDDO respectively. The VSS signal required by the GOA unit is continuously generated by the characteristics of the VDDO/VDDE signal, thereby saving GOA peripheral VSS signal lines and the lines connected to VSS in the GOA, further reducing the area occupied by the GOA unit (by adjusting the TFT layout of the GOA unit, TFT is added to the dummy area in the GOA between every two lines, and no additional border is added). This configuration can further reduce the frame design, and facilitate achieving extremely narrow frames.

The foregoing has provided a detailed description on a shift register unit, a gate driving circuit and a display apparatus according to some embodiments of the present disclosure. Specific examples are used herein to describe the principles and implementations of some embodiments.

The description is only used to help understanding some of the possible methods and concepts. Meanwhile, those of ordinary skill in the art can change the specific implementation manners and the application scope according to the concepts of the present disclosure. The contents of this specification therefore should not be construed as limiting the disclosure, In addition, those of ordinary skill in the art will also understand that the embodiments described in the specification are just some of the embodiments, and the involved actions and portions are not necessarily all required to realize the functions of the various embodiments.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion such that a process, method, article, or apparatus that comprises a list of elements including not only those elements but also those that are not explicitly listed, or other elements that are inherent to such processes, methods, goods, or equipment.

In the case of no more limitation, the element defined by the sentence "includes a . . . " does not exclude the existence of another identical element in the process, the method, the commodity, or the device including the element.

In the descriptions, with respect to device(s), terminal(s), etc., in some occurrences singular forms are used, and in some other occurrences plural forms are used in the descriptions of various embodiments. It should be noted, however, that the single or plural forms are not limiting but rather are for illustrative purposes. Unless it is expressly stated that a single device, or terminal, etc. is employed, or it is expressly stated that a plurality of devices, or terminals, etc. are employed, the device(s), terminal(s), etc. can be singular, or plural.

Based on various embodiments of the present disclosure, the disclosed apparatuses, devices, and methods can be implemented in other manners. For example, the abovementioned terminals devices are only of illustrative purposes, and other types of terminals and devices can employ the methods disclosed herein.

Dividing the terminal or device into different "portions," "regions" "or "components" merely reflect various logical functions according to some embodiments, and actual implementations can have other divisions of "portions," "regions," or "components" realizing similar functions as described above, with or without such divisions. For example, multiple portions, regions, or components can be combined or can be integrated into another system. In addition, some features can be omitted, and some steps in the methods can be skipped.

Those of ordinary skill in the art will appreciate that the portions, or components, etc. in the devices provided by various embodiments described above can be configured in one or more devices capable of utilizing the components as described above. They can also be located in one or multiple devices that is (are) different from the example embodiments described above or illustrated in the accompanying drawings. For example, the circuits, portions, or components, etc. in various embodiments described above can be integrated into one module or divided into several sub-modules.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation to encompass such modifications and equivalent structures.

The invention claimed is:

1. A shift register unit, comprising:
a shift circuit; and
a signal generating circuit;
wherein:
the shift circuit comprises a first power supply signal terminal, a second power supply signal terminal, a third power supply signal terminal and an output terminal, the first power supply signal terminal being connected to a first power supply line, the first power supply line being utilized to transmit a first power supply signal; the second power supply signal terminal being connected to a second power supply line, the second power supply line being utilized to transmit a second power supply signal; the third power supply signal terminal being connected to a third power supply line, the third power supply line being utilized to transmit a third power supply signal; the shift circuit being configured to respond to the first power supply signal or the second power supply signal and output an output signal from a first node to the output terminal; and
the signal generating circuit being respectively connected to the first power supply line, the second power supply line, and the first node, the signal generating circuit being configured to output the second power supply signal to the first node when an electric potential of the first power supply signal is an effective potential, and the signal generating circuit also being configured to output the first power supply signal to the first node when the electric potential of the second power supply signal is an effective potential, and wherein the electric potential of the first power supply signal and the electric potential of the second power supply signal are complementary to each other.

2. The shift register unit according to claim 1, wherein the signal generating circuit comprises:
a first signal generating sub-circuit; and
a second signal generating sub-circuit;
wherein:
the first signal generating circuit is respectively connected to the first power supply line, the second power supply line, and the first node, and wherein the first signal generating sub-circuit is utilized to transmit a second power supply signal when the electric potential of the first power supply signal is an effective potential;
the second signal generating sub-circuit is connected to the first power supply line, the second power supply line, and the first node, the second signal generating sub-circuit being utilized to transmit a first power supply signal to the first node when the electric potential of the second power supply signal is an effective potential.

3. The shift register unit according to claim 2, wherein the first signal generating sub-circuit further comprises:
a first transistor and a gate electrode, wherein:
the gate electrode of the first transistor is connected to the first power supply line,
the first electrode of the first transistor is connected to the second power supply line, and
the second electrode of the first transistor is connected to the first node.

4. The shift register unit according to claim 3, wherein the second signal generating sub-circuit comprises:
a second transistor; wherein:
the gate electrode of the second transistor is connected to the second power supply line, the first electrode of the second transistor is connected to the first power supply line, and the second electrode of the second transistor is connected to the first node.

5. The shift register unit according to claim 4, wherein the transistor of the first signal generating sub-circuit and the transistor of the second signal generating sub-circuit are both N-type transistors.

6. The shift register unit according to claim 1, wherein the shift circuit further comprises:
a first pull-down sub-circuit and a second pull-down sub-circuit;
wherein:
the first pull-down sub-circuit is respectively connected to the first power supply signal terminal, the third power supply signal terminal and the output terminal, the first pull-down sub-circuit response to the first power supply signal and outputs the signal form the third power supply signal terminal to the output terminal;

the second pull-down sub-circuit is respectively connected to the second power supply signal terminal, the third power supply signal terminal and the output terminal, the second pull-down sub-circuit responses to the second power supply signal and outputs the signal from the third power supply signal terminal to the output terminal.

7. The shift register unit according to claim 1, wherein the shift circuit further comprises:

a clock signal terminal;

an input signal terminal; and a reset signal terminal;

wherein:

the clock signal terminal is connected to a clock signal line that is utilized to transmit a clock signal;

the shift circuit further responses to an input signal from the input signal terminal and output the clock signal from the clock signal terminal to the output terminal, and response to the reset signal from the reset signal terminal, the first power supply signal and the second power supply signal and outputs the signal from the first node to the output terminal.

8. A display apparatus comprising a gate driving circuit including the shift register unit according to claim 1, wherein the gate driving circuit is configured to perform:

transmitting, in a first stage, the electric potential of the first power supply signal utilizing the first power supply line that the electric potential of the first power supply is an effective potential;

transmitting, in the first stage, the electric potential of the second power supply signal transmitted by the second power supply line that the electric potential of the second power supply is an ineffective potential;

utilizing the signal generating circuit to respond to the first power supply signal and output the second power supply signal to the first node;

utilizing the shift circuit to respond to the first power supply signal and output a corresponding signal from the first node to the output terminal;

transmitting, during a second stage, the electric potential of the first power supply signal utilizing the first power supply line that the electric potential of the first power supply is an in effective potential;

transmitting, in the second stage, the electric potential of the second power supply signal transmitted by the second power supply line is an effective potential, the signal generating circuit responses to the second power supply signal and outputs the first power supply signal to the first node, the shift circuit responses to the second power supply signal and outputs the signal from the first node to the output terminal.

9. The display apparatus according to claim 8, wherein the signal generating signal comprises a first signal generating sub-circuit and a second signal generating sub-circuit, wherein the first signal generating sub-circuit comprises a first transistor, and wherein the second signal generating sub-circuit comprises a second transistor;

wherein:

during the first stage, the electric potential of the first power supply signal is an effective potential, the electric potential of the second power supply signal is an ineffective potential, the first transistor is turned on, the second power supply line outputs the second power supply signal to the first node through the first transistor;

during the second stage, the electric potential of the first power supply signal is an ineffective potential, the electric potential of the second power supply signal is an effective potential, the second transistor is turned on, the first power supply line outputs the first power supply signal to the first node through the second transistor.

10. A gate driving circuit, wherein the gate driving circuit comprises at least two cascaded shift register units;

wherein among the at least two cascaded shift register units, at least one shift register unit is the shift register unit according to claim 1.

11. The gate driving circuit according to claim 10, wherein:

the at least two cascaded shift register units are identical.

12. The gate driving circuit according to claim 11, wherein the gate driving circuit further comprises a plurality of clock signal lines, at least one clock signal line associates with each cascaded shift register unit.

13. The gate driving circuit according to claim 12, wherein a total of four clock signal lines are provided in the gate driving circuit.

14. The gate driving circuit according to claim 10, wherein:

the at least two cascaded shift register units include a first shift register unit, and a second shift register unit having the shift circuit; and the third power supply signal terminal of the shift circuit of the second shift register unit is connected to the first node of the first shift register unit.

15. The gate driving circuit according to claim 10, wherein the plurality of cascaded shift register units are provided in a plurality of pairs, wherein at least one shift unit of each pair of adjacent shift register units can be the shift register unit having an associated shift circuit and an associated signal generating circuit wherein a second shift register unit of the pair does not include an associated signal generating circuit.

16. The gate driving circuit according to claim 10, wherein each of the plurality of cascaded shift register units include an associated shift circuit and an associated signal generating circuit.

17. A display apparatus having a display screen having at least one associated gate driving circuit of claim 10, the gate driving circuit being configured to drive at least a portion of the display screen of the display apparatus.

18. The display apparatus of claim 17, wherein the display screen comprises a liquid-crystal display (LCD).

19. The display apparatus of claim 17, wherein the display screen comprises an organic light-emitting diode (OLED) display.

20. The display apparatus of claim 17, further comprising a speaker.

\* \* \* \* \*